US012805316B2

(12) United States Patent
Kimoto et al.

(10) Patent No.: US 12,805,316 B2
(45) Date of Patent: Nov. 17, 2026

(54) POWER SEMICONDUCTOR DEVICE AND METHOD FOR MANUFACTURING POWER SEMICONDUCTOR DEVICE

(71) Applicant: Mitsubishi Electric Corporation, Tokyo (JP)

(72) Inventors: Nobuyoshi Kimoto, Fukuoka (JP); Mitsunori Aiko, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 372 days.

(21) Appl. No.: 18/576,203

(22) PCT Filed: Sep. 21, 2021

(86) PCT No.: PCT/JP2021/034527
§ 371 (c)(1),
(2) Date: Jan. 3, 2024

(87) PCT Pub. No.: WO2023/047451
PCT Pub. Date: Mar. 30, 2023

(65) Prior Publication Data
US 2024/0234237 A1 Jul. 11, 2024

(51) Int. Cl.
*H10W 40/25* (2026.01)
*H10W 70/02* (2026.01)
(Continued)

(52) U.S. Cl.
CPC ......... *H10W 40/25* (2026.01); *H10W 70/027* (2026.01); *H10W 72/00* (2026.01);
(Continued)

(58) Field of Classification Search
None
See application file for complete search history.

(56) References Cited

U.S. PATENT DOCUMENTS

2011/0298121 A1* 12/2011 Nishibori ............ H10W 40/255 257/784
2012/0001309 A1 1/2012 Soyano
(Continued)

FOREIGN PATENT DOCUMENTS

JP H02-000737 U 1/1990
JP H08-031967 A 2/1996
(Continued)

OTHER PUBLICATIONS

An Office Action; "Notice of Reasons for Refusal," mailed by the Japanese Patent Office on Aug. 27, 2024, which corresponds to Japanese Patent Application No. 2023-549185 and is related to U.S. Appl. No. 18/576,203; with English language translation.
(Continued)

*Primary Examiner* — Sue A Purvis
*Assistant Examiner* — Jordan M Klein
(74) *Attorney, Agent, or Firm* — Studebaker Brackett PLLC

(57) ABSTRACT

Provided is a power semiconductor device with high heat dissipation from a semiconductor element. The power semiconductor device includes a semiconductor device, a heat sink, grease, an adhesive, and a terminal block, the semiconductor device including the semiconductor element, a sealant sealing the semiconductor element, and a power terminal electrically connected to the semiconductor element, wherein a first area as a selective area of a lower surface of the semiconductor device is bonded to the heat sink through the adhesive, the semiconductor device is in contact with the heat sink through the grease in a second area that is an area other than the selective area of the lower surface of the semiconductor device, the terminal block includes an electrode on an upper surface of the terminal block, and the power terminal is fastened to the terminal
(Continued)

1a block, and is electrically connected to the electrode of the terminal block.

19 Claims, 18 Drawing Sheets

(51) Int. Cl.
*H10W 72/00* (2026.01)
*H10W 74/10* (2026.01)
*H10W 76/60* (2026.01)
*H10W 90/00* (2026.01)

(52) U.S. Cl.
CPC ......... *H10W 74/121* (2026.01); *H10W 76/60* (2026.01); *H10W 90/00* (2026.01)

(56) References Cited

U.S. PATENT DOCUMENTS

| | | | | |
|---|---|---|---|---|
| 2012/0001318 | A1* | 1/2012 | Mamitsu | H10W 40/47<br>257/713 |
| 2016/0276245 | A1* | 9/2016 | Murai | H10W 40/22 |

FOREIGN PATENT DOCUMENTS

| | | | | | |
|---|---|---|---|---|---|
| JP | 2004-311905 | A | | 11/2004 | |
| JP | 2009-017751 | A | | 1/2009 | |
| JP | 2010-186931 | A | | 8/2010 | |
| JP | 2010-219264 | A | | 9/2010 | |
| JP | 2012-015349 | A | | 1/2012 | |
| JP | 2013-012520 | A | | 1/2013 | |
| JP | 2014013884 | A | * | 1/2014 | |
| JP | 2015-084609 | A | | 4/2015 | |
| WO | 2015/102046 | A1 | | 7/2015 | |
| WO | WO-2017221730 | A1 | * | 12/2017 | H10W 90/00 |

OTHER PUBLICATIONS

International Search Report issued in PCT/JP2021/034527; mailed Dec. 7, 2021.
"Notice of Reasons for Refusal" Office Action issued in JP 2023-549185; mailed by the Japanese Patent Office on Feb. 4, 2025.

* cited by examiner

1a

1a

POWER SEMICONDUCTOR DEVICE AND METHOD FOR MANUFACTURING POWER SEMICONDUCTOR DEVICE

TECHNICAL FIELD

The present disclosure relates to a power semiconductor device and a method for manufacturing the power semiconductor device.

BACKGROUND ART

Patent Document 1 discloses a semiconductor device with a heat sink. In a structure of Patent Document 1, the heat sink is bonded to a package including a semiconductor through a polymer-based adhesive applied around a thermal conductive grease to cover the thermal conductive grease.

PRIOR ART DOCUMENT

Patent Document

Patent Document 1: Japanese Unexamined Utility Model Application Publication No. H02-000737

SUMMARY

Problem to be Solved by the Invention

When the polymer-based adhesive is interposed between the heat sink and the thermal conductive grease, heat dissipation from a semiconductor element deteriorates because the adhesive has low thermal conductivity.

The present disclosure has been conceived to solve the problem, and has an object of providing a power semiconductor device with high heat dissipation from a semiconductor element.

Means to Solve the Problem

A power semiconductor device according to the present disclosure includes a semiconductor device, a heat sink, grease, an adhesive, and a terminal block, the semiconductor device including a semiconductor element, a sealant sealing the semiconductor element, and a power terminal electrically connected to the semiconductor element, wherein a first area that is a selective area of a lower surface of the semiconductor device is bonded to the heat sink through the adhesive, the semiconductor device is in contact with the heat sink through the grease in a second area that is an area other than the selective area of the lower surface of the semiconductor device, the terminal block includes an electrode on an upper surface of the terminal block, and the power terminal of the semiconductor device is fastened to the terminal block, and is electrically connected to the electrode of the terminal block.

Effects of the Invention

The present disclosure provides a power semiconductor device with high heat dissipation from a semiconductor element.

The objects, features, aspects, and advantages related to the technology disclosed in the DESCRIPTION will become more apparent from the following detailed description and the accompanying drawings.

DESCRIPTION OF EMBODIMENTS

A. Embodiment 1

[A-1. Structure]

Figure 1:
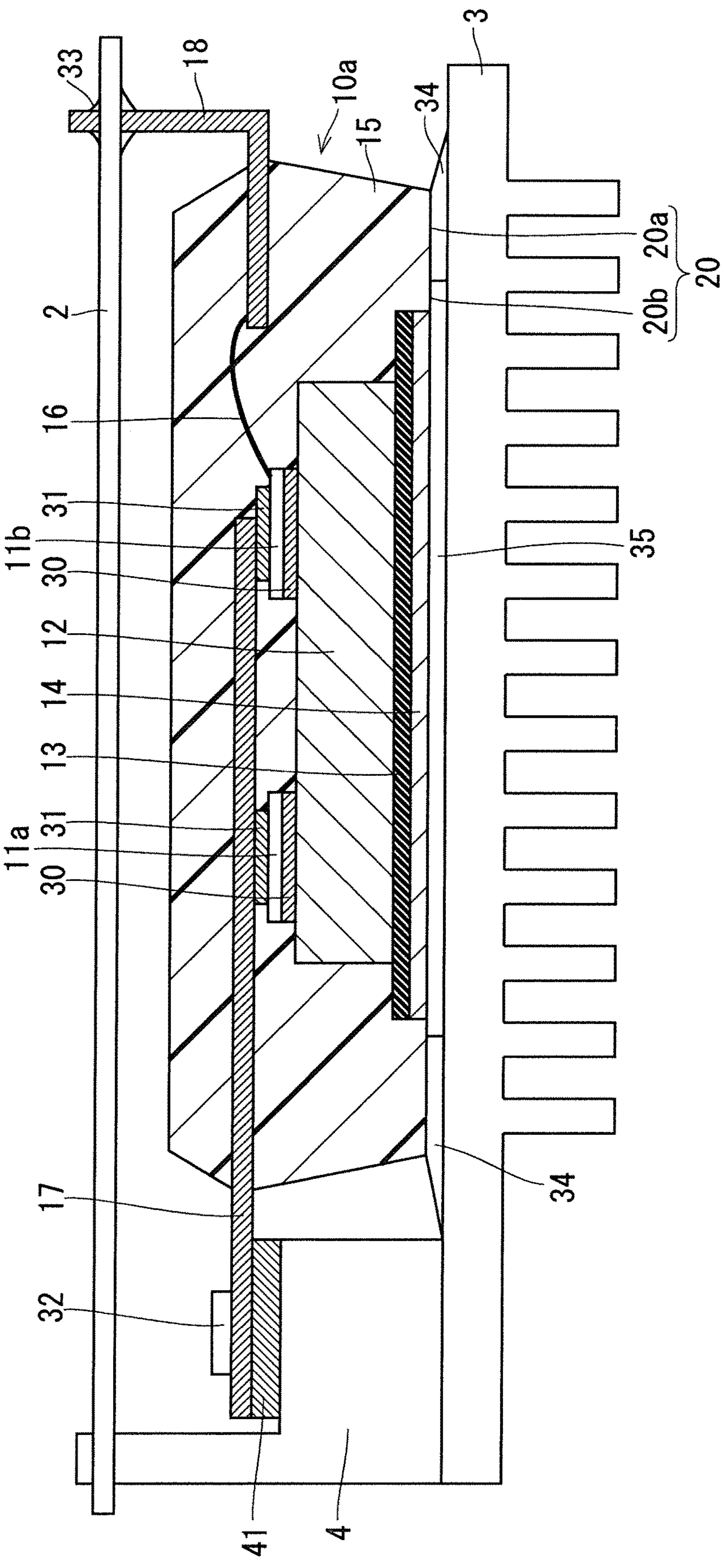
FIG. 1 illustrates a power semiconductor device according to Embodiment 1.

FIG. 1 illustrates a power semiconductor device 1*a* according to Embodiment 1.

The power semiconductor device 1*a* includes a printed circuit board 2 that is a circuit board, a heat sink 3, a terminal block 4, a semiconductor device 10*a*, bolts 32, an adhesive 34, and grease 35.

Figure 2:
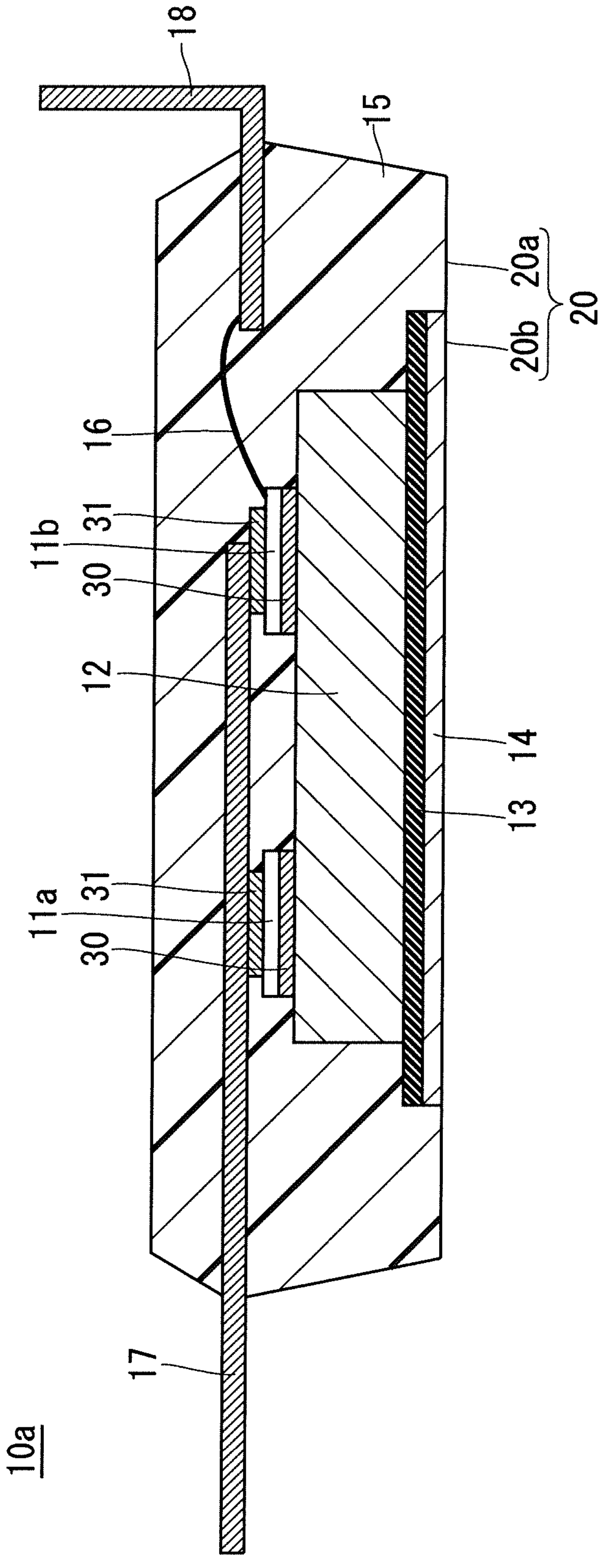
FIG. 2 illustrates a semiconductor device according to Embodiment 1.
Figure 3:
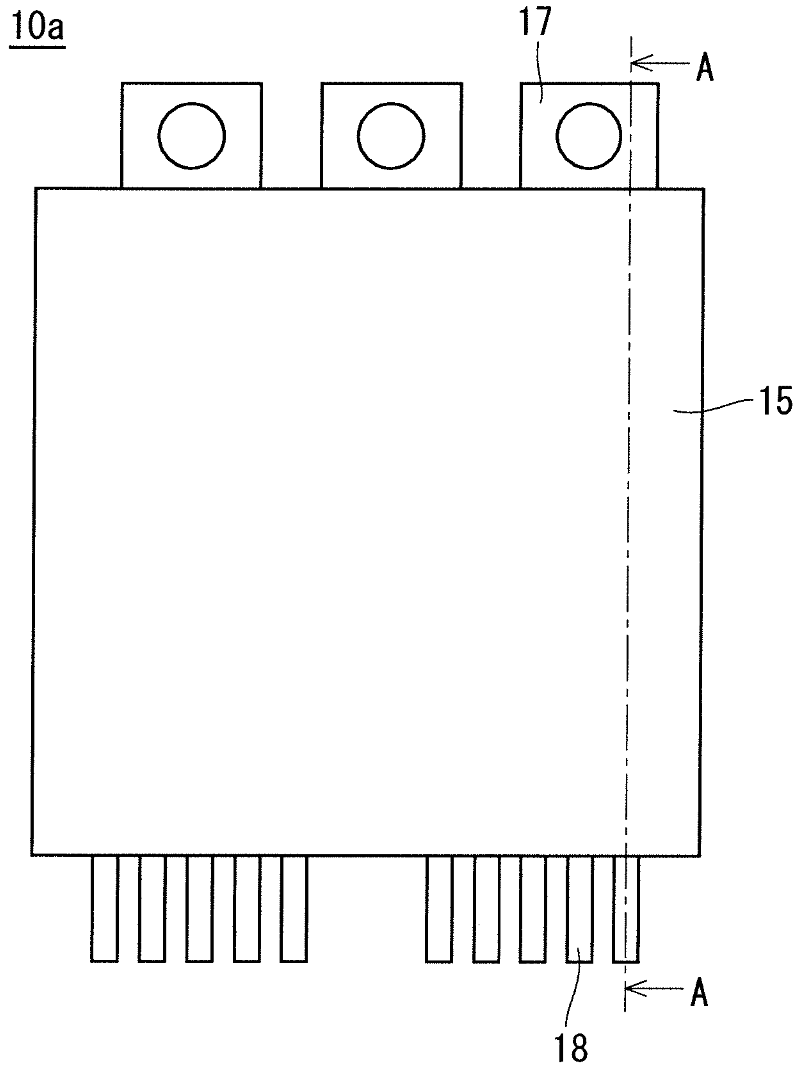
FIG. 3 illustrates a semiconductor device according to Embodiment 1.

FIG. 2 illustrates the semiconductor device 10*a*. FIG. 3 is a plan view of the semiconductor device 10*a* when viewed from the top. FIG. 2 is a cross-sectional view taken along, for example, a line A-A in FIG. 3.

As illustrated in FIGS. 2 and 3, the semiconductor device 10*a* includes a semiconductor element 11*a*, a semiconductor element 11*b*, a heat spreader 12, an insulator 13, a metal foil 14, a sealant 15, wires 16, a plurality of main terminals 17, and a plurality of signal terminals 18.

The insulator 13 is plate-shaped. The metal foil 14 is bonded to a lower surface of the insulator 13. The heat spreader 12 is bonded to an upper surface of the insulator 13. The metal foil 14 is exposed on a lower surface 20 of the semiconductor device 10*a*.

The semiconductor element 11*a* is, for example, a diode. The semiconductor element 11*b* is, for example, a metal-oxide semiconductor field-effect transistor (MOSFET).

The semiconductor element 11*a*, the semiconductor element 11*b*, and the wires 16 are sealed by the sealant 15. The semiconductor device 10*a* is, for example, a transfer molded semiconductor device. The sealant 15 is, for example, a resin.

The main terminals 17 are partially sealed by the sealant 15. The main terminals 17 protrude from the sealant 15 on a side portion of the semiconductor device 10*a*. The signal terminals 18 are partially sealed by the sealant 15. The signal terminals 18 protrude from the sealant 15 on a side portion of the semiconductor device 10*a*.

Each of the semiconductor element 11*a* and the semiconductor element 11*b* is bonded to an upper surface of the heat spreader 12 through a bonding material 30. The bonding material 30 is, for example, a sintered metal material or solder.

The main terminals 17 are power terminals. The main terminal 17 illustrated in FIG. 2 is bonded to each of the semiconductor element 11*a* and the semiconductor element 11*b* through a bonding material 31 inside the sealant 15. This electrically connects the main terminal 17 to the semiconductor element 11*a* and the semiconductor element 11*b*. The main terminal 17 different from the one in FIG. 2 is bonded to, for example, the heat spreader 12. The bonding material 31 is, for example, a sintered metal material or solder.

Each of the signal terminals 18 is electrically connected to the semiconductor element 11*b* through a corresponding one of the wires 16 inside the sealant 15. Each of the signal terminals 18 is electrically connected through the wire 16 to a signal pad (e.g., a gate pad, a current sense pad, or a temperature sense pad) included in the semiconductor element 11*b*.

As illustrated in FIG. 1, an area 20*a* (an example of a first area) that is a selective area of the lower surface 20 of the semiconductor device 10*a* is bonded to the heat sink 3 through the adhesive 34. As also illustrated in FIG. 1, the semiconductor device 10*a* is in contact with the heat sink 3 through the grease 35 in an area 20*b* (an example of a second area) that is an area other than the area 20*a* of the lower surface 20 of the semiconductor device 10*a*.

The sealant 15 is exposed on the surface of the semiconductor device 10*a* partially in the area 20*a* and the area 20*b*. The metal foil 14 is exposed on the surface of the semiconductor device 10*a* in the area 20*b*.

The area 20*a* and the area 20*b* are, for example, flush with each other.

The area 20*b*, for example, overlaps the semiconductor element 11*a* and the semiconductor element 11*b* in a plan view, and overlaps the heat spreader 12 in the plan view. The area 20*a* is, for example, a peripheral area of the lower surface 20 of the semiconductor device 10*a*. The area 20*b* is, for example, a central area of the lower surface 20 of the semiconductor device 10*a*. The area 20*a* may be, for example, the entire peripheral area of the lower surface 20 of the semiconductor device 10*a* and an area surrounding the area 20*b*, or a portion of the peripheral area of the lower surface 20 of the semiconductor device 10*a*. The area 20*b* may include a portion of the peripheral area of the lower surface 20 of the semiconductor device 10*a*.

The heat generated by the semiconductor element 11*a* and the semiconductor element 11*b* in the power semiconductor device 1*a* is, for example, conducted to the heat sink 3 through the heat spreader 12, the insulator 13, the metal foil 14, and the grease 35. The grease 35 has thermal conductivity higher than that of the adhesive 34. The presence of a heat dissipation path from the semiconductor element 11*a* and the semiconductor element 11*b* to the heat sink 3 through the grease 35 without through the adhesive 34 facilitates the conduction of the heat from the semiconductor element 11*a* and the semiconductor element 11*b* to the heat sink 3.

As illustrated in FIG. 1, the signal terminals 18 of the semiconductor device 10*a* are connected to the printed circuit board 2 through a bonding material 33. The bonding material 33 is, for example, solder. The signal terminals 18 are electrically connected to an electrical circuit (not illustrated) formed on the printed circuit board 2.

As illustrated in FIG. 1, the terminal block 4 includes an electrode 41 on an upper surface portion of the terminal block 4. The terminal block 4 is fastened to the heat sink 3. The main terminals 17 of the semiconductor device 10*a* are fastened to the terminal block 4 through the bolts 32. Furthermore, the main terminals 17 of the semiconductor device 10*a* are electrically connected to the electrode 41 of the terminal block 4. The terminal block 4 includes, for example, an electrode (not illustrated) different from the electrode 41 to which the main terminals 17 of the semiconductor device 10*a* are connected, and is configured to allow a current to pass through the semiconductor device 10*a* from a circuit outside of the semiconductor device 10*a* through the different electrode.

Figure 4:
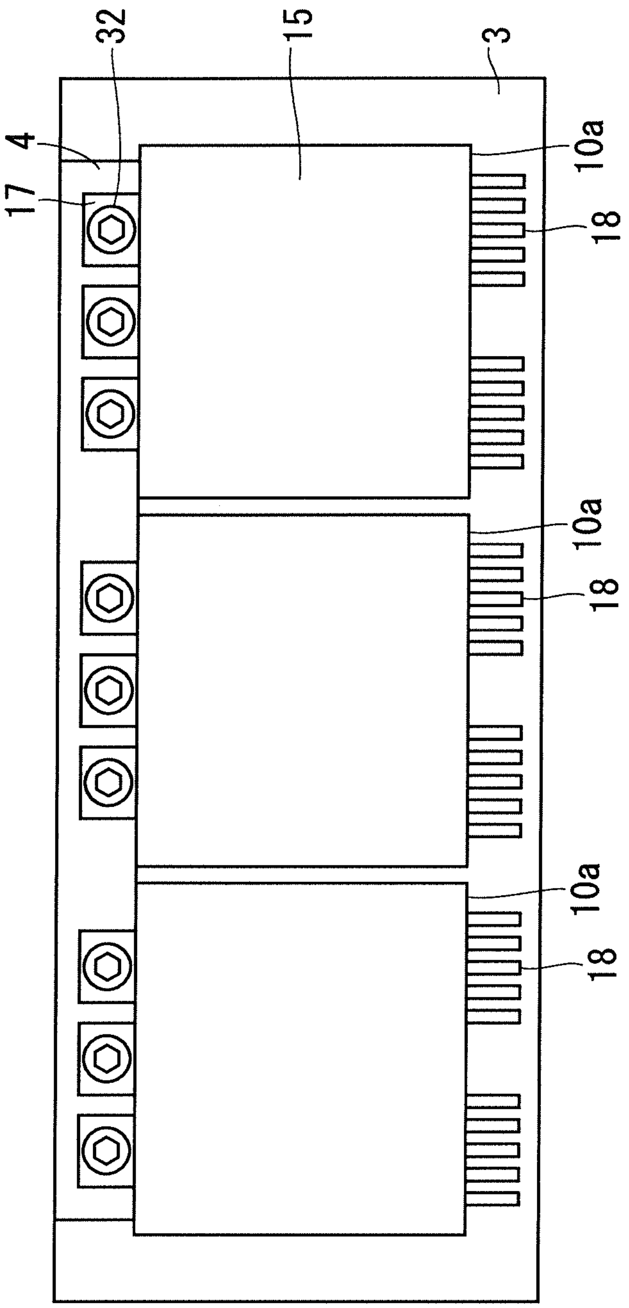
FIG. 4 is a plan view of the power semiconductor device according to Embodiment 1 when viewed from the top.

FIG. 4 is a plan view of the power semiconductor device 1*a* when viewed from the top. FIG. 4 omits the printed circuit board 2 to be easily seen. FIG. 4 illustrates a structure of the power semiconductor device 1*a* including three semiconductor devices 10*a*. The number of the semiconductor devices 10*a* included in the power semiconductor device 1*a* may be one or two, or four or more.

As described above, the power semiconductor device 1*a* according to Embodiment 1 includes the semiconductor device 10*a*, the heat sink 3, the grease 35, and the adhesive 34. The semiconductor device 10*a* includes the semiconductor elements 11*a* and 11*b*, and the sealant 15 sealing the semiconductor elements 11*a* and 11*b*. The area 20*a* that is a selective area of the lower surface 20 of the semiconductor device 10*a* is bonded to the heat sink 3 through the adhesive 34. The semiconductor device 10*a* is in contact with the heat sink 3 through the grease 35 in the area 20*b* that is an area other than the area 20*a* of the lower surface 20 of the semiconductor device 10*a*.

Since the semiconductor device 10*a* is in contact with the heat sink 3 through the grease 35 in the area 20*b* in the power semiconductor device 1*a* according to Embodiment 1, heat dissipation from the semiconductor elements 11*a* and 11*b* is high.

In the power semiconductor device 1*a* according to Embodiment 1, the semiconductor device 10*a* is bonded to the heat sink 3 through the adhesive 34. Since the semiconductor device 10*a* is bonded to the heat sink 3 through the adhesive 34, components for fastening the semiconductor device 10*a* such as struts 51, springs 52, and a support plate 53 in a power semiconductor device 1*z* of a comparative example (see [Z. Comparative example]) to be described below can be reduced. Reduction of these can downsize the semiconductor device 10*a*, reduce the weight of the semiconductor device 10*a*, and reduce the number of assembly steps. When the adhesive 34 completely surrounds a perimeter of the grease 35 in a plan view, the adhesive 34 prevents the grease 35 from pumping out and increases the longevity of the product.

Z. Comparative Example

The power semiconductor device 1*z* of the comparative example differs from the power semiconductor device 1*a* according to Embodiment 1 in that the semiconductor device 10*a* is fastened to the heat sink 3 through the support plate 53 and the springs 52, which replaces the semiconductor device 10*a* bonded and fastened to the heat sink 3 through the adhesive 34. The power semiconductor device 1*z* is identical to the power semiconductor device 1*a* according to Embodiment 1 in other respects.

Figure 16:
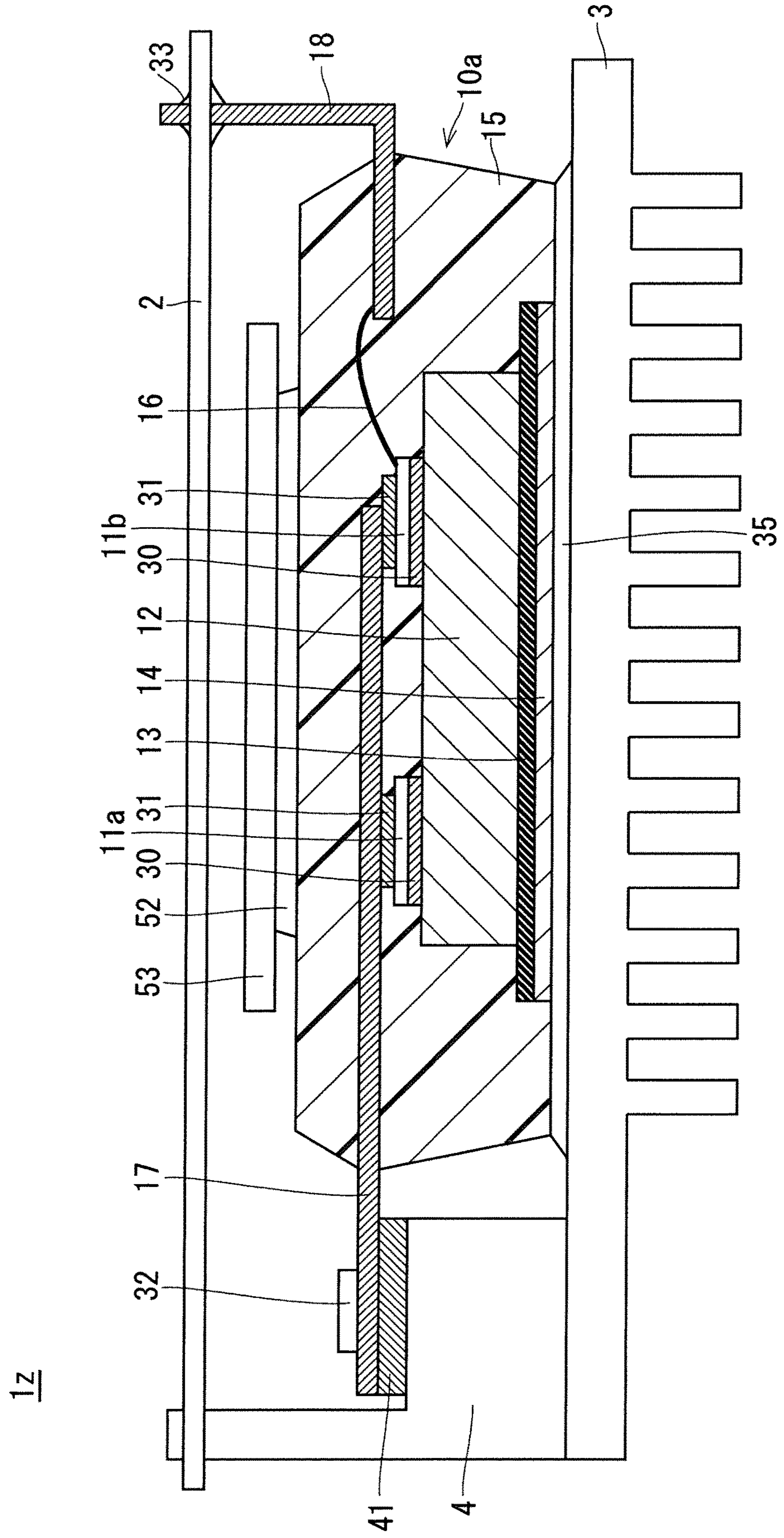
FIG. 16 illustrates a power semiconductor device of a comparative example.
Figure 17:
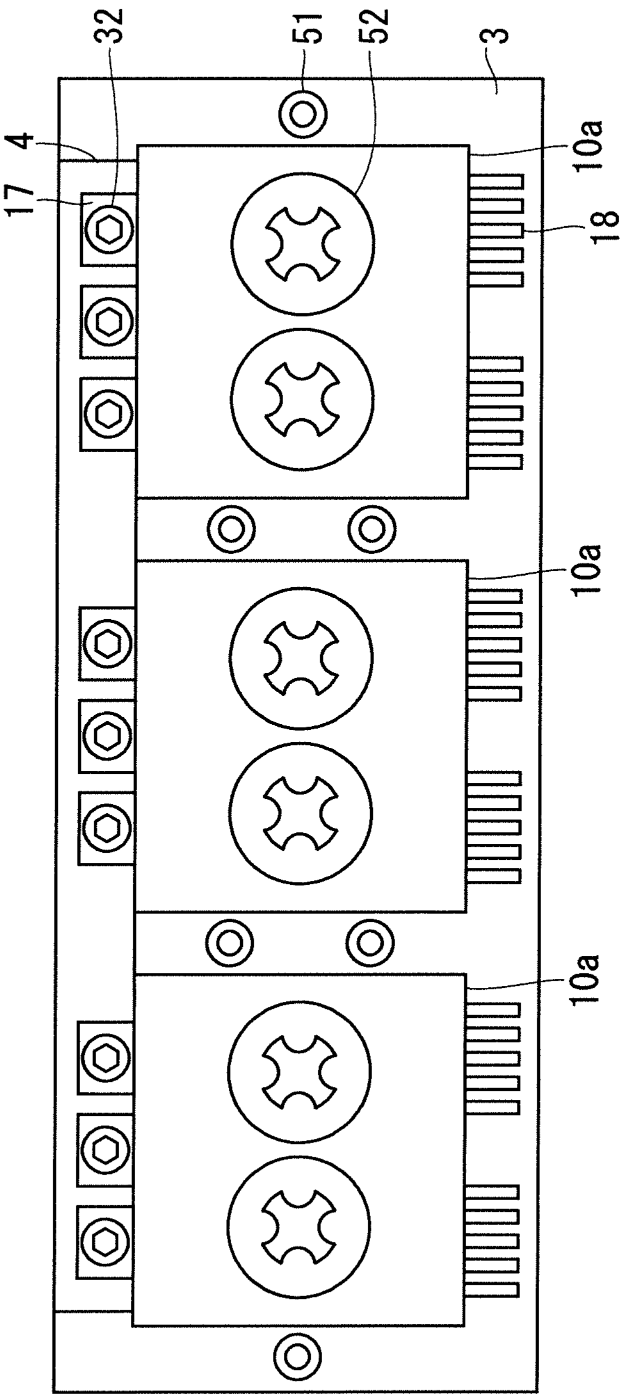
FIG. 17 illustrates the power semiconductor device of the comparative example.
Figure 18:
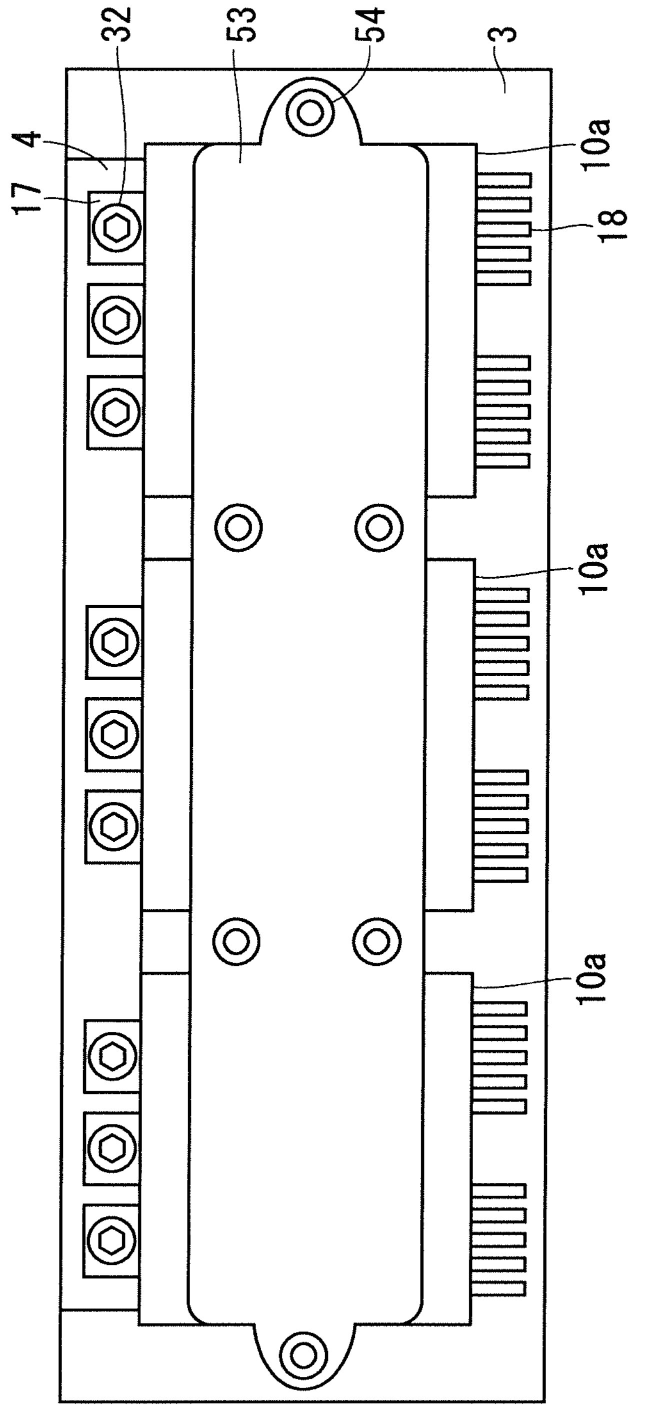
FIG. 18 illustrates the power semiconductor device of the comparative example.

FIG. 16 is a cross-sectional view of the power semiconductor device 1*z* of the comparative example. FIGS. 17 and 18 are plan views of the power semiconductor device 1*z* of the comparative example.

As illustrated in FIGS. 17 and 18, the support plate 53 is secured by the struts 51 and bolts 54. The support plate 53 is fastened to the heat sink 3 through the struts 51.

FIG. 17 omits the printed circuit board 2 and the support plate 53 to be easily seen. FIG. 18 omits the printed circuit board 2 to be easily seen.

B. Embodiment 2

A power semiconductor device 1*b* according to Embodiment 2 differs from the power semiconductor device 1*a* according to Embodiment 1 by including a semiconductor device 10*b* instead of the semiconductor device 10*a*. The power semiconductor device 1*b* is identical to the power semiconductor device 1*a* in other respects.

Figure 5:
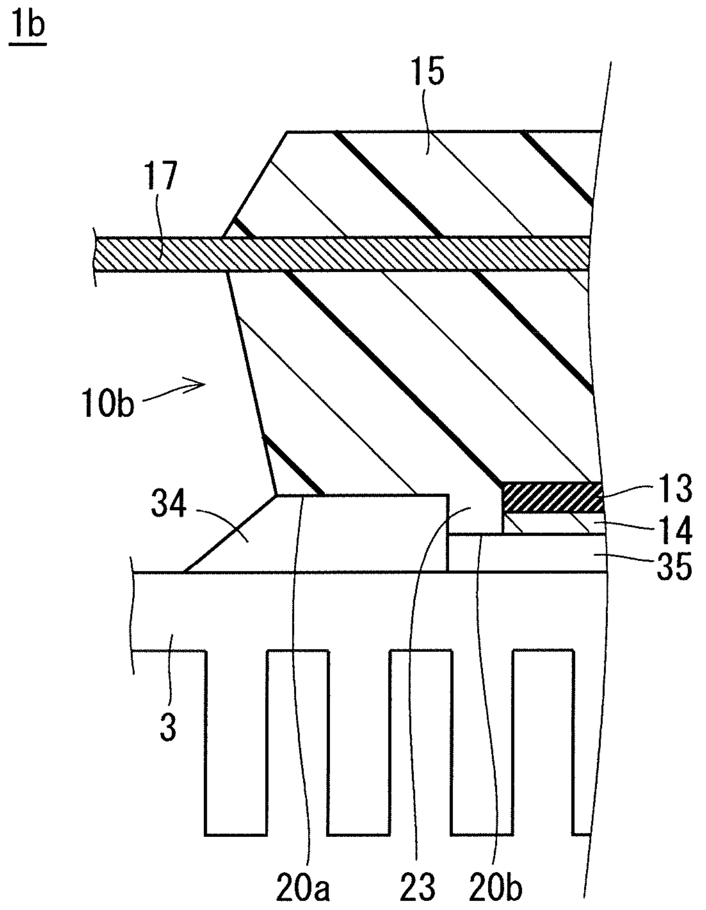
FIG. 5 illustrates a power semiconductor device according to Embodiment 2.

The semiconductor device 10*b* differs from the semiconductor device 10*a* in that the area 20*b* of the lower surface 20 protrudes below the area 20*a* (i.e., toward the heat sink 3) as illustrated in FIG. 5. The semiconductor device 10*b* is identical to the semiconductor device 10*a* in other respects.

The area 20*a* of the lower surface 20 of the semiconductor device 10*b* is bonded to the heat sink 3 through the adhesive 34 in the power semiconductor device 1*b*, similarly to the power semiconductor device 1*a*. Furthermore, the semiconductor device 10*b* is in contact with the heat sink 3 through the grease 35 in the area 20*b* of the lower surface 20 of the semiconductor device 10*b*. The metal foil 14 is exposed on the surface of the semiconductor device 10*b* in the area 20*b* of the lower surface 20.

Figure 6:
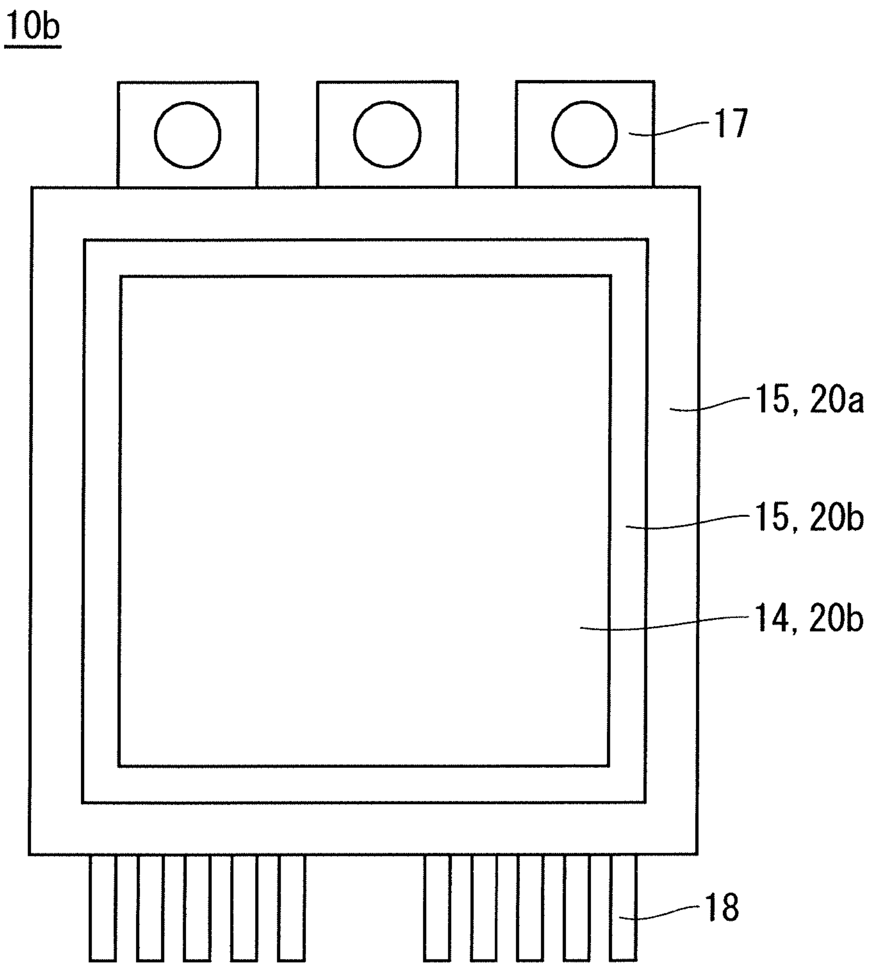
FIG. 6 is a plan view illustrating one example of the semiconductor device according to Embodiment 2 when viewed from the bottom.
Figure 7:
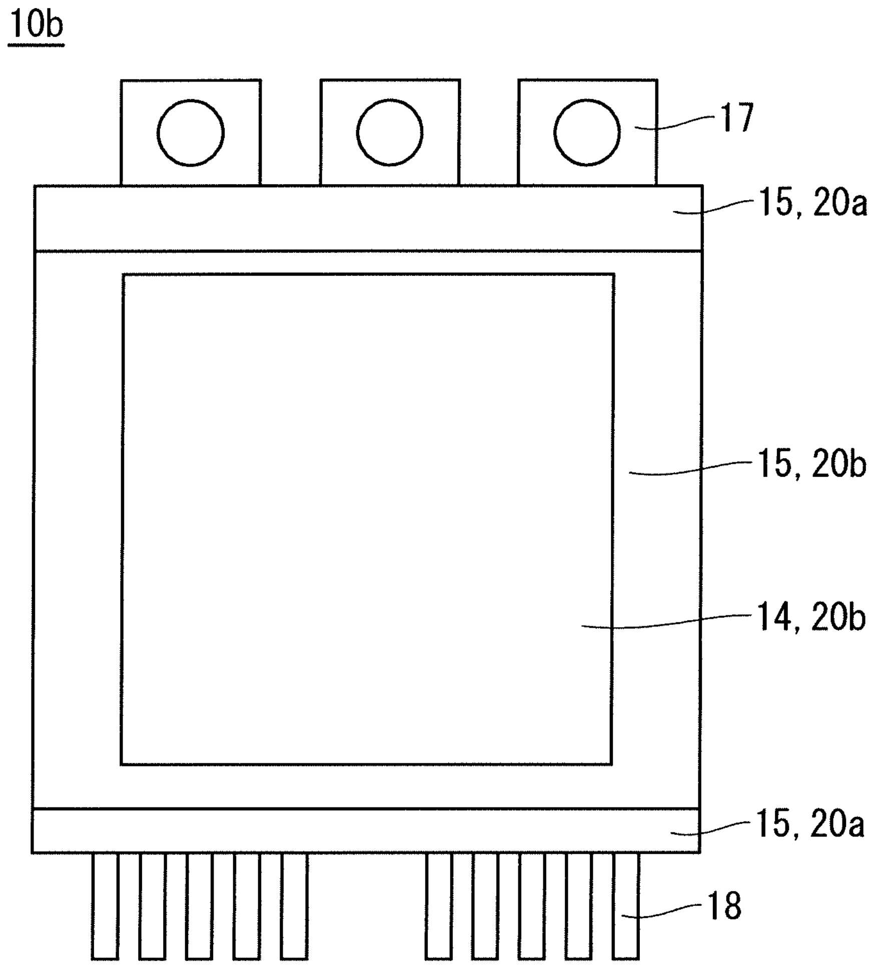
FIG. 7 is a plan view illustrating one example of the semiconductor device according to Embodiment 2 when viewed from the bottom.

FIG. 6 is a plan view illustrating one example of the semiconductor device 10*b* when viewed from the bottom. FIG. 7 is a plan view illustrating another example of the semiconductor device 10*b* when viewed from the bottom. The area 20*a* may be the entire peripheral area of the lower surface 20 and surround the area 20*b* in a plan view as illustrated in FIG. 6. The area 20*a* may be portions of the peripheral area of the lower surface 20 as illustrated in FIG. 7. In FIG. 7, areas 20*a* are areas along two facing sides of the rectangular lower surface 20.

In the semiconductor device 10*b*, protrusion of the area 20*b* of the lower surface 20 below the area 20*a* creates a step between the area 20*a* and the area 20*b*. The step is created by the sealant 15. In other words, a side portion of the step between the area 20*a* and the area 20*b* is covered with a portion 23 of the sealant 15 which protrudes below the area 20*a*. The area 20*b* includes a lower surface of the portion 23 of the sealant 15. In other words, the sealant 15 is exposed on the area 20*b*. The lower surface of the portion 23 of the sealant 15 is flush with, for example, the lower surface of the metal foil 14. The area 20*b* including the lower surface of the portion 23 of the sealant 15 and the lower surface of the metal foil 14 is, for example, flat.

The step between the area 20*a* and the area 20*b* can ensure a distance between the heat sink 3 and the lower surface 20 in a portion of the area 20*a* of the lower surface 20 to some extent to ensure the adhesion strength using the adhesive 34, and reduce a distance between the heat sink 3 and the lower surface 20 in a portion of the area 20*b* of the lower surface 20 to increase heat dissipation.

C. Embodiment 3

A power semiconductor device 1*c* according to Embodiment 3 differs from the power semiconductor device 1*b* according to Embodiment 2 by including a semiconductor device 10*c* instead of the semiconductor device 10*b*. The power semiconductor device 1*c* is identical to the power semiconductor device 1*b* in other respects.

Figure 8:
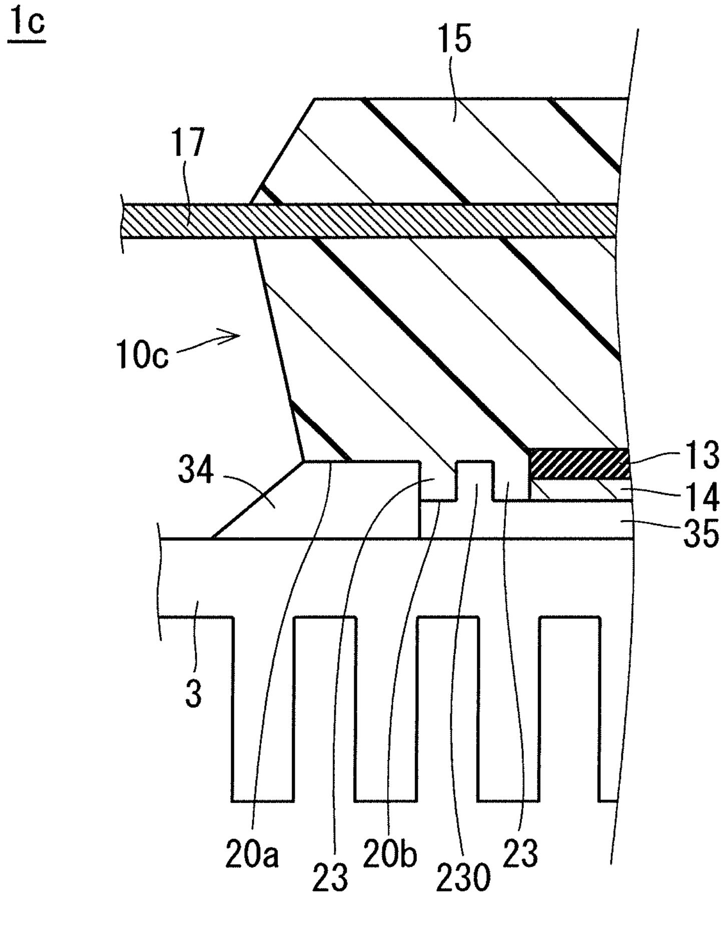
FIG. 8 illustrates a power semiconductor device according to Embodiment 3.

The semiconductor device 10*c* differs from the semiconductor device 10*b* by including a groove 230 on a lower surface of the portion 23 of the sealant 15, that is, a portion on which the sealant 15 is exposed in the area 20*b*. The semiconductor device 10*c* is identical to the semiconductor device 10*b* in other respects. FIG. 8 illustrates the vicinity of the groove 230 in the power semiconductor device 1*c*.

The grease 35 enters the groove 230 in the power semiconductor device 1*c*. The grease 35 entering the groove 230 when the power semiconductor device 1*c* is manufactured can reduce variations in thickness of the grease 35 in an in-plane direction. Thus, the accuracy of the assembly will be increased.

Although the power semiconductor device 1*c* has a structure obtained by adding the groove 230 to the power semiconductor device 1*b* according to Embodiment 2 in the description above, the power semiconductor device 1*c* may have a structure obtained by adding the groove 230 to the power semiconductor device 1*a* according to Embodiment 1. In this case, the groove 230 is also formed in a portion on which the sealant 15 is exposed in the area 20*b* of the lower surface 20 of the semiconductor device 10*c*. Moreover, the grease 35 entering the groove 230 when the power semiconductor device 1*c* is manufactured can also reduce variations in thickness of the grease 35 in an in-plane direction. Thus, the accuracy of the assembly will be increased.

D. Embodiment 4

A power semiconductor device 1*d* according to Embodiment 4 differs from the power semiconductor device 1*b* according to Embodiment 2 by including a semiconductor device 10*d* instead of the semiconductor device 10*b*. The power semiconductor device 1*d* is identical to the power semiconductor device 1*b* in other respects.

Figure 9:
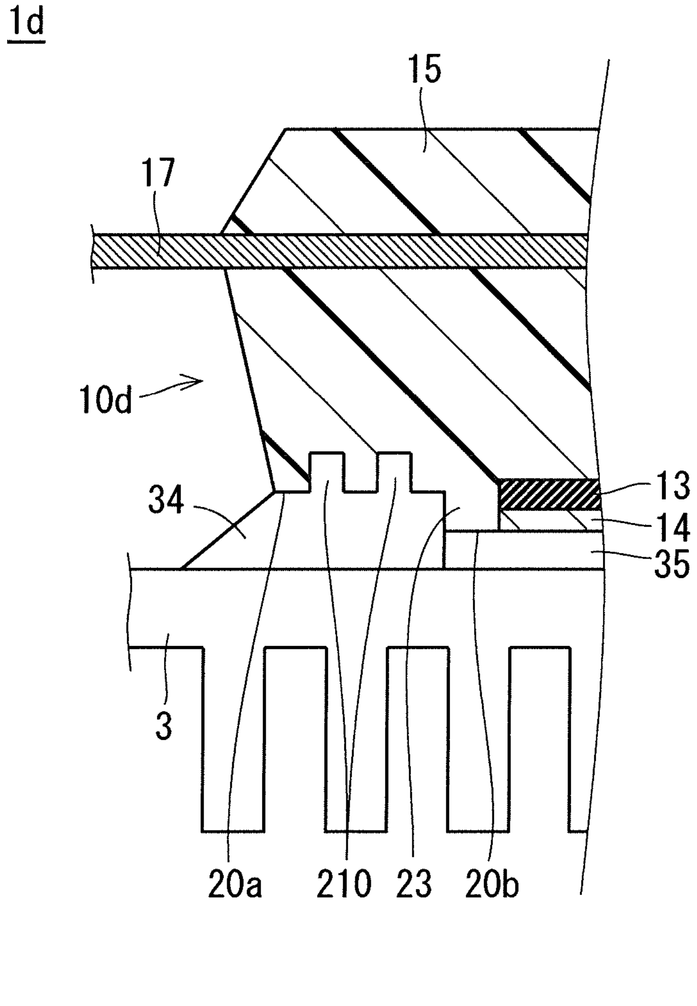
FIG. 9 illustrates a power semiconductor device according to Embodiment 4.

The semiconductor device 10*d* differs from the semiconductor device 10*b* by including grooves 210 in the area 20*a*. The semiconductor device 10*d* is identical to the semiconductor device 10*b* in other respects. FIG. 9 illustrates the vicinity of the grooves 210 in the power semiconductor device 1*d*.

The entirety of the area 20*a* is, for example, the surface of the sealant 15. When the sealant 15 is exposed on a portion of the area 20*a*, the grooves 210 are formed, for example, in the portion of the area 20*a* on which the sealant 15 is exposed.

Since the adhesive 34 enters the grooves 210 in the power semiconductor device 1*d*, the adhesion strength between the semiconductor device 10*d* and the heat sink 3 through the adhesive 34 will be increased by the anchor effect.

Although the power semiconductor device 1*d* has a structure obtained by adding the grooves 210 to the power semiconductor device 1*b* according to Embodiment 2 in the description above, the power semiconductor device 1*d* may have a structure obtained by adding the grooves 210 to the area 20*a* of the power semiconductor device 1*a* according to Embodiment 1 or the power semiconductor device 1*c* according to Embodiment 3.

E. Embodiment 5

A power semiconductor device 1*e* according to Embodiment 5 differs from the power semiconductor device 1*b* according to Embodiment 2 by including a semiconductor device 10*e* instead of the semiconductor device 10*b*. The power semiconductor device 1*e* is identical to the power semiconductor device 1*b* in other respects.

Figure 10:
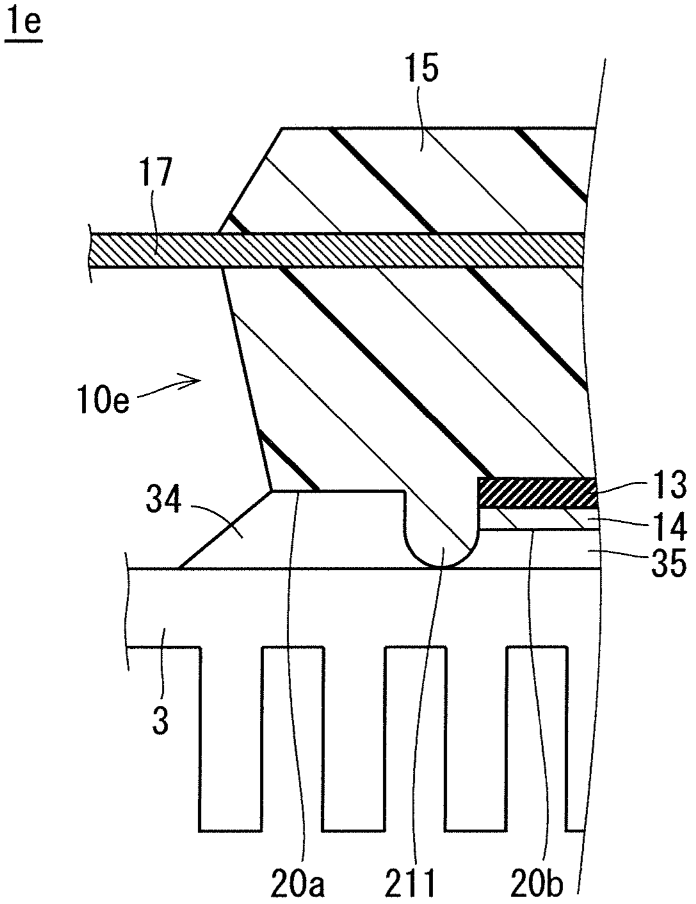
FIG. 10 illustrates a power semiconductor device according to Embodiment 5.

The semiconductor device 10*e* differs from the semiconductor device 10*b* in that the sealant 15 includes a plurality of protrusions 211. The semiconductor device 10*e* is identical to the semiconductor device 10*b* in other respects. FIG. 10 illustrates the vicinity of the protrusions 211 in the power semiconductor device 1*e*.

As illustrated in FIG. 10, the protrusions 211 protrude below the area 20*b*. The protrusions 211 are formed, for example, in a boundary between the areas 20*a* and 20*b*.

Figure 11:
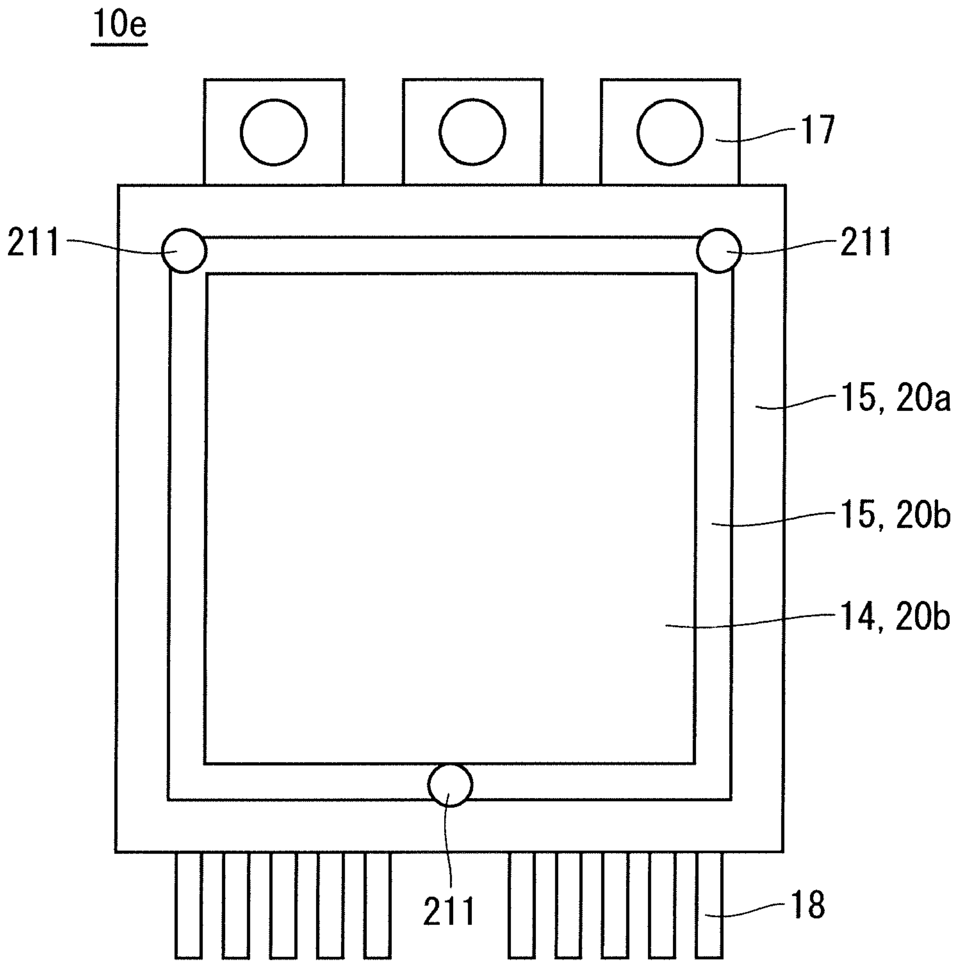
FIG. 11 is a plan view illustrating one example of the semiconductor device according to Embodiment 5 when viewed from the bottom.

FIG. 11 is a plan view illustrating one example of the semiconductor device 10*e* when viewed from the bottom. The protrusions 211 are formed, for example, at three portions as illustrated in FIG. 11. When the protrusions 211 are formed pointwise on the lower surface 20 of the semiconductor device 10*e*, the protrusions 211 are preferably formed at three or more portions to stabilize the orientation of the semiconductor device 10*e* pressed to the heat sink 3.

In the power semiconductor device 1*e*, the semiconductor device 10*e* is bonded and fastened to the heat sink 3 through the adhesive 34 with the protrusions 211 being in contact with the heat sink 3.

The contact of the protrusions 211 with the heat sink 3 can increase the contact stress. Thus, the semiconductor device can be stably fastened to the heat sink 3.

Although the power semiconductor device 1*e* has a structure obtained by adding the protrusions 211 to the power semiconductor device 1*b* according to Embodiment 2 in the description above, the power semiconductor device 1*e* may have a structure obtained by adding the protrusions 211 to one of the power semiconductor device 1*a* according to Embodiment 1, the power semiconductor device 1*c* according to Embodiment 3, and the power semiconductor device 1*d* according to Embodiment 4.

F. Embodiment 6

An upper surface of the electrode 41 of the terminal block 4 is relatively lower than the main terminals 17 in a power semiconductor device 1*f* according to Embodiment 6, when compared to that in the power semiconductor device 1*b* according to Embodiment 2. The power semiconductor device 1*f* is identical to the power semiconductor device 1*b* in other respects. The structure of the semiconductor device 10*f* included in the power semiconductor device 1*f* according to Embodiment 6 is identical to that of the semiconductor device 10*b* included in the power semiconductor device 1*b*.

In the power semiconductor device 1*f*, a lower surface of each of the main terminals 17 of the semiconductor device 10*f* in a portion at which the main terminal 17 protrudes from the sealant 15 of the semiconductor device 10*f*, that is, a boundary between a portion of the main terminal 17 which is sealed by the sealant 15 and a portion of the main terminal 17 which is not sealed by the sealant 15 is higher than the upper surface of the electrode 41 of the terminal block 4.

Figure 12:
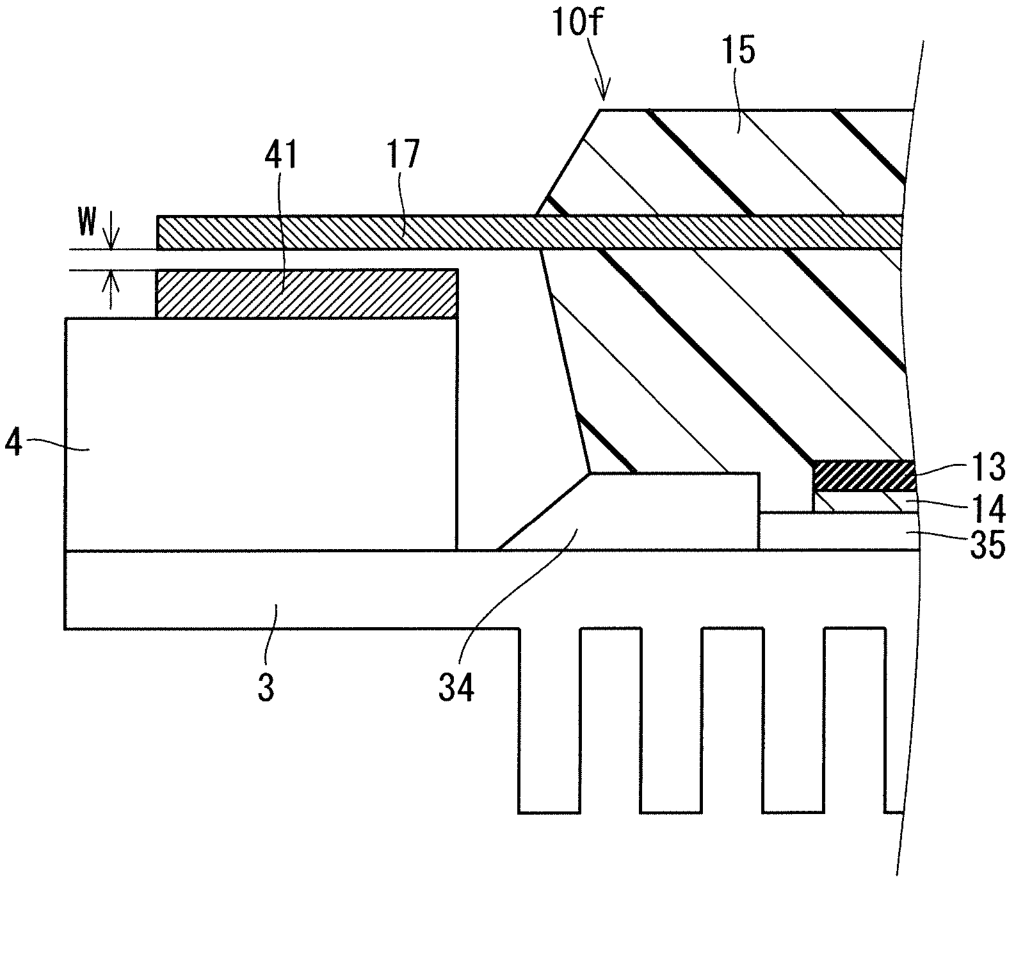
FIG. 12 illustrates a power semiconductor device being manufactured according to Embodiment 6.
Figure 13:
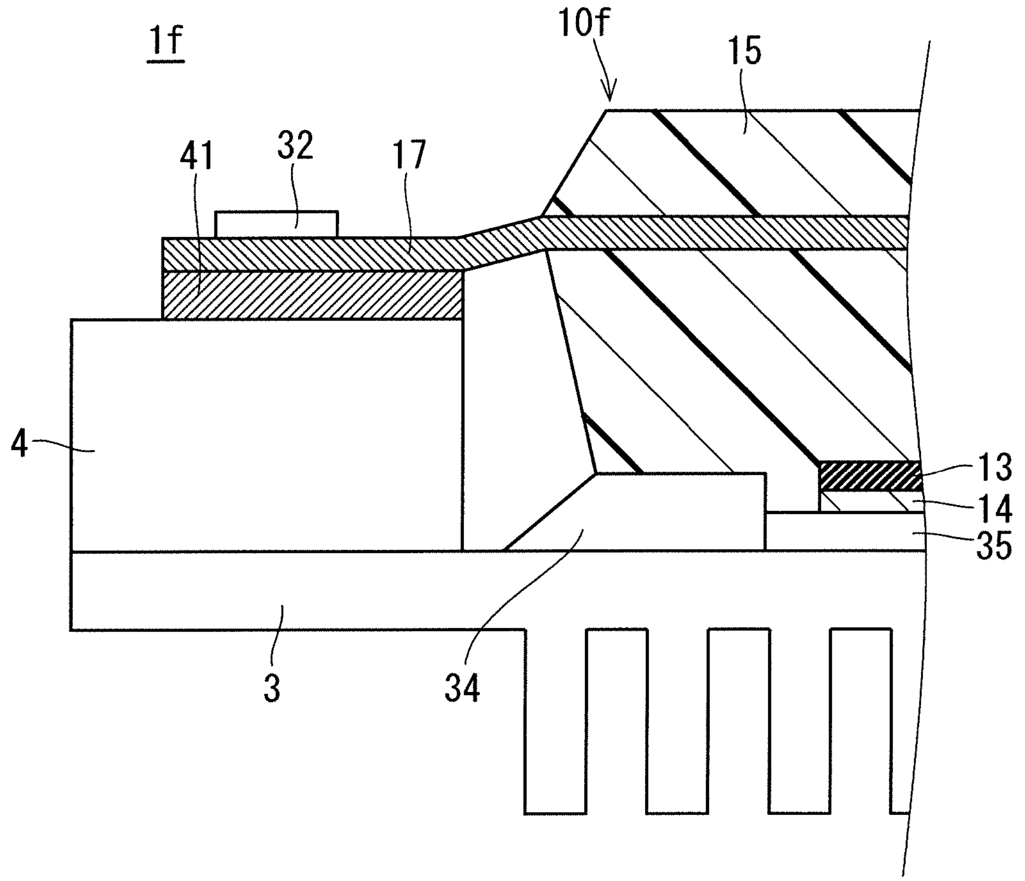
FIG. 13 illustrates a power semiconductor device according to Embodiment 6.

FIG. 13 illustrates the vicinity of the portion at which the main terminals 17 of the semiconductor device 10*f* are fastened to the electrode 41 of the terminal block 4 in the power semiconductor device 1*f*. Furthermore, FIG. 12 illustrates a state after the semiconductor device 10*f* is disposed on the heat sink 3 and before the main terminals 17 of the semiconductor device 10*f* are fastened to the electrode 41 of the terminal block 4 during manufacture (see Embodiment 8 on a method for manufacturing the power semiconductor device 1*f*).

Before the main terminals 17 are secured and fastened to the terminal block 4 by the bolts 32, the power semiconductor device 1*f* being manufactured has, for example, a clearance W between the main terminals 17 and the electrode 41 of the terminal block 4 as illustrated in FIG. 12. Securing the main terminals 17 to the terminal block 4 by the bolts 32 from this state deforms the main terminals 17 downward and fastens the main terminals 17 to the terminal block 4. This makes the lower surface of each of the main terminals 17 of the semiconductor device 10*f* in the portion at which the main terminal 17 protrudes from the sealant 15 of the semiconductor device 10*f* higher than the upper surface of the electrode 41 of the terminal block 4 as illustrated in FIG. 13.

Deforming the main terminals 17 downward and fastening the main terminals 17 to the terminal block 4 presses the semiconductor device 10*f* to the heat sink 3 and tightly fastens the semiconductor device 10*f* to the heat sink 3.

Although the power semiconductor device 1*f* has a structure obtained by making the upper surface of the electrode 41 of the terminal block 4 relatively lower than the main terminals 17 in the structure of the power semiconductor device 1*b* according to Embodiment 2 in the description above, the power semiconductor device 1*f* may have a structure obtained by making the upper surface of the electrode 41 of the terminal block 4 relatively lower than the main terminals 17 in the structure of one of the power semiconductor device 1*a* according to Embodiment 1, the power semiconductor device 1*c* according to Embodiment 3, the power semiconductor device 1*d* according to Embodiment 4, and the power semiconductor device 1*e* according to Embodiment 5.

G. Embodiment 7

The semiconductor elements 11*a* and 11*b* in the power semiconductor devices 1*a* to 1*f* according to Embodiments 1 to 6 are, for example, semiconductor elements each including a silicon semiconductor.

A power semiconductor device (will be referred to as a power semiconductor device 1*g*) according to Embodiment 7 is one of the power semiconductor devices 1*a* to 1*f* according to Embodiments 1 to 6, and is a power semiconductor device in which at least one of the semiconductor elements 11*a* and 11*b* is a semiconductor element including a wide-bandgap semiconductor. Both of the semiconductor elements 11*a* and 11*b* may be semiconductor elements each including a wide-bandgap semiconductor. Examples of the wide bandgap semiconductor include SiC, gallium nitride, gallium oxide, and diamond.

The semiconductor element including the wide-bandgap semiconductor is smaller in element size than a semiconductor element including a Si semiconductor. When a semiconductor device including a semiconductor element including a wide bandgap semiconductor is used, a power module is often constructed by combining multiple constituent elements including the semiconductor devices 10*a* to 10*f*. Each of the power semiconductor devices 1*a* to 1*f* is, for example, such a power module or a device including the power module.

When the multiple constituent elements including the semiconductor devices 10*a* to 10*f* are combined, the number and the cost of the components such as the struts 51, the springs 52, and the support plate 53 increase in the structure of the power semiconductor device 1*z* in [Z. Comparative example]. In contrast, the power semiconductor device 1*g* according to Embodiment 7 does not require the components such as the struts 51, the springs 52, and the support plate 53 unlike the power semiconductor device 1*z*, and can reduce the number and the cost of the components. In other words, the structures of the power semiconductor devices 1*a* to 1*f* according to Embodiments 1 to 6 are more effective at reducing the number of the components when at least one of the semiconductor elements 11*a* and 11*b* is a semiconductor element including a wide-bandgap semiconductor.

H. Embodiment 8

Embodiment 8 will describe a method for manufacturing the power semiconductor devices 1*a* to 1*g* according to Embodiments 1 to 7.

Figure 14:
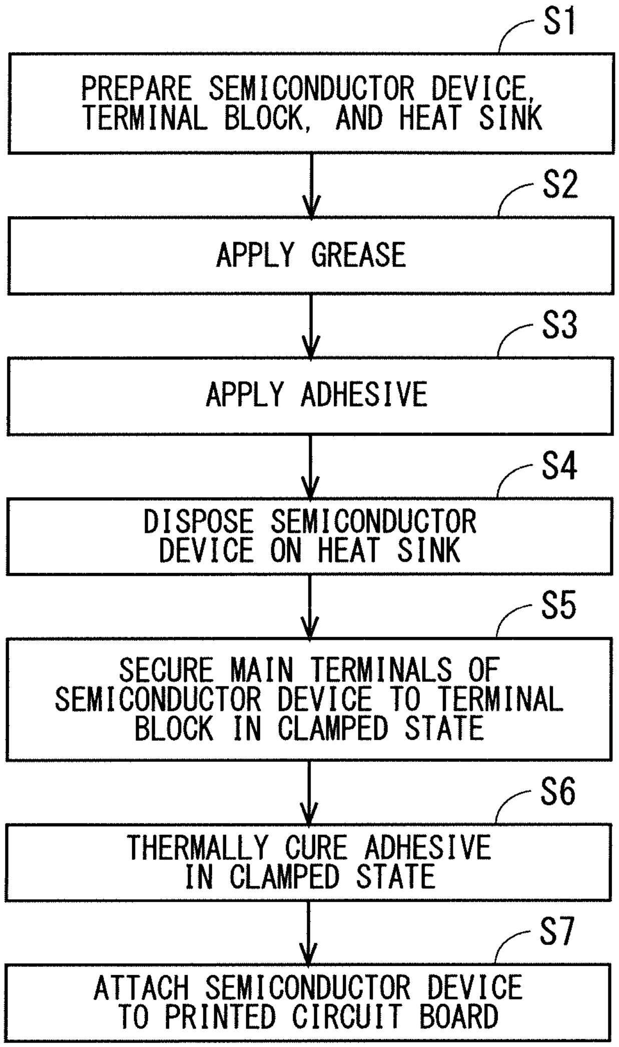
FIG. 14 is a flowchart illustrating a method for manufacturing a power semiconductor device according to Embodiment 7.

FIG. 14 is a flowchart illustrating the method for manufacturing the power semiconductor devices according to Embodiment 8. Although Embodiment 8 will be described based on the power semiconductor device 1*a* as a power semiconductor device to be manufactured, the power semiconductor devices 1*a* may be replaced with one of the power semiconductor devices 1*b* to 1*g*.

First, in Step S1, the semiconductor device 10*a*, the terminal block 4, and the heat sink 3 are prepared. The terminal block 4 is, for example, fastened to the heat sink 3 in advance.

Next, in Step S2, the grease 35 is applied to the area 20*b* of the lower surface 20 of the semiconductor device 10*a* by, for example, printing.

Next, in Step S3, the adhesive 34 is applied to the area 20*a* of the lower surface 20 of the semiconductor device 10*a*.

Figure 15:
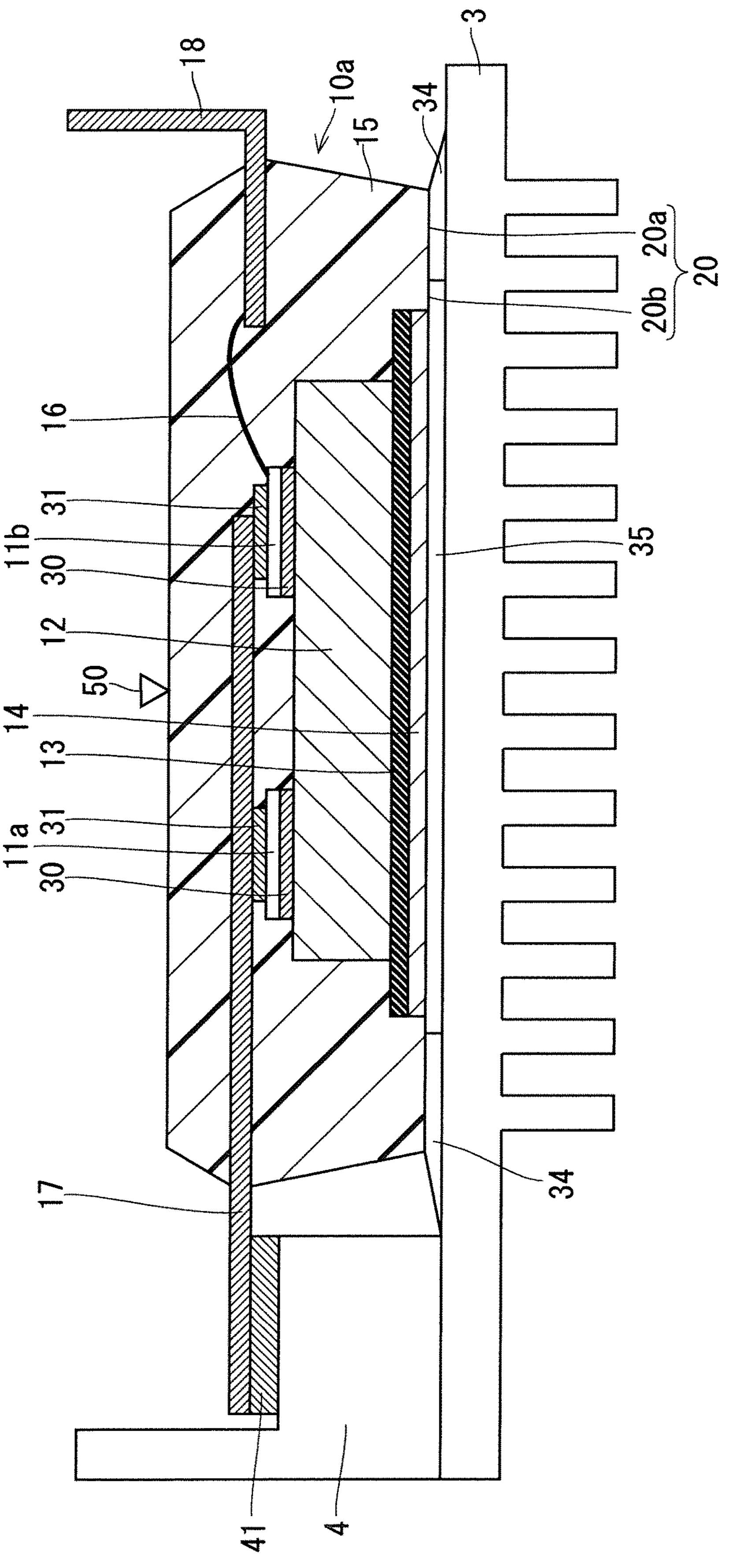
FIG. 15 illustrates a power semiconductor device being manufactured in the method for manufacturing the power semiconductor device according to Embodiment 7.

Next, in Step S4, the semiconductor device 10*a* is disposed on the heat sink 3, and is fastened by a clamp fixture 50. After the end of Step S4, the semiconductor device 10*a* is disposed on the heat sink 3 while being fastened to the heat sink 3 by the clamp fixture 50 as illustrated in FIG. 15. The clamp fixture 50 presses the semiconductor device 10*a* to the heat sink 3.

Next, in Step S5, the bolts 32 are tightened to secure the main terminals 17 to the terminal block 4 and fasten the main terminals 17 to the terminal block 4 while the semiconductor device 10*a* is fastened by the clamp fixture 50. The main terminals 17 may be fastened to the terminal block 4 by welding, instead of using the bolts 32.

Next, in Step S6, the adhesive 34 is thermally cured while the semiconductor device 10*a* is fastened by the clamp fixture 50. This bonds and fastens the semiconductor device 10*a* to the heat sink 3. After Step S6, the semiconductor device 10*a* is unfastened from the clamp fixture 50.

Next, in Step S7, the semiconductor device 10*a* fastened to the heat sink 3 is attached to the printed circuit board 2. These steps produce the power semiconductor device 1*a*.

In Steps S2 and S3, the grease 35 and the adhesive 34 may be applied not to the lower surface 20 of the semiconductor device 10*a* but to the heat sink 3.

The clamp fixture for fastening the semiconductor device 10*a* in Step S5 may be different from that for fastening the semiconductor device 10*a* in Step S6.

While the semiconductor device 10*a* is fastened by the clamp fixture 50, execution of Steps S5 and S6 can secure the main terminals 17 and thermally cure the adhesive with the semiconductor device 10*a* being pressed to the heat sink 3, independently of, for example, variations in amount of the grease to be applied. This can tightly fasten the semiconductor device 10*a* to the heat sink 3.

The power semiconductor device 1*f* according to Embodiment 6 has, for example, the clearance W between the lower surface of each of the main terminals 17 and the electrode 41 of the terminal block 4 with no external force being applied to the main terminals 17, after the semiconductor device 10*f* is disposed on the heat sink 3 in Step S4 and before the main terminals 17 are fastened to the terminal block 4 in Step S5 (see FIG. 12). Fastening the main terminals 17 to the terminal block 4 from this state deforms the main terminals 17 downward and presses the semiconductor device 10*f* to the heat sink 3. This fastens the semiconductor device 10*f* to the heat sink 3 more tightly.

The lower surface of each of the main terminals 17 may be as high as the upper surface of the electrode 41 of the terminal block 4 after the semiconductor device 10*f* is disposed on the heat sink 3 in Step S4 and before the main terminals 17 are fastened to the terminal block 4 in Step S5. In this case, securing the main terminals 17 to the terminal block 4 by, for example, the bolts 32 to fasten the main terminals 17 to the terminal block 4 also deforms the main terminals 17 downward and presses the semiconductor device 10*f* to the heat sink 3.

Embodiments can be freely combined, and appropriately modified or omitted.

EXPLANATION OF REFERENCE SIGNS

1*a*, 1*b*, 1*c*, 1*d*, 1*e*, 1*f*, 1*g*, 1*z* power semiconductor device, 2 printed circuit board, 3 heat sink, 4 terminal block, 10*a*, 10*b*, 10*c*, 10*d*, 10*e*,10*f* semiconductor device, 11*a*, 11*b* semiconductor element, 12 heat spreader, 13 insulator, 14 metal foil, 15 sealant, 16 wire, 17 main terminal, 18 signal terminal, 20 lower surface, 20*a*, 20*b* area, 30, 31 bonding material, 32 bolt, 33 bonding material, 34 adhesive, 35 grease, 41 electrode, 50 clamp fixture, 51 strut, 52 spring, 53 support plate, 54 bolt, 210, 230 groove, 211 protrusion, W clearance.

The invention claimed is:

1. A power semiconductor device, comprising:

a semiconductor device;

a heat sink;

grease;

an adhesive; and a terminal block, the semiconductor device including a semiconductor element, a sealant sealing the semiconductor element, and a power terminal electrically connected to the semiconductor element, wherein a first area that is a selective area of a lower surface of the semiconductor device is bonded to the heat sink through the adhesive, the semiconductor device is in contact with the heat sink through the grease in a second area that is an area other than the selective area of the lower surface of the semiconductor device, the terminal block includes an electrode on an upper surface of the terminal block, and the power terminal of the semiconductor device is fastened to the terminal block, and is electrically connected to the electrode of the terminal block, such that the power terminal is in a deformed state that compresses the semiconductor device against the heat sink.

2. The power semiconductor device according to claim 1, wherein the first area is a peripheral area of the lower surface of the semiconductor device.

3. The power semiconductor device according to claim 1, wherein the first area is an area completely surrounding a perimeter of the second area in a plan view.

4. The power semiconductor device according to claim 1, further comprising a circuit board, wherein the semiconductor device further includes a signal terminal electrically connected to the semiconductor element, and the signal terminal is connected to the circuit board.

5. The power semiconductor device according to claim 1, wherein the second area protrudes toward the heat sink with respect to the first area on the lower surface of the semiconductor device, and a side portion of a step between the first area and the second area is covered with the sealant.

6. The power semiconductor device according to claim 1, wherein the sealant is exposed on the second area, and a first groove is formed in a portion of the second area on which the sealant is exposed, and the grease enters the first groove.

7. The power semiconductor device according to claim 1, wherein the sealant is exposed on the first area, and a second groove is formed in a portion of the first area on which the sealant is exposed, and the adhesive enters the second groove.

8. The power semiconductor device according to claim 1, wherein the semiconductor element includes a wide-bandgap semiconductor.

9. The power semiconductor device according to claim 8, wherein the wide-bandgap semiconductor is a SiC semiconductor.

10. The power semiconductor device according to claim 1, wherein the terminal block is fastened to the heat sink.

11. The power semiconductor device according to claim 1, wherein a lower surface of the power terminal in a portion at which the power terminal protrudes from the sealant is higher than an upper surface of the electrode of the terminal block.

12. The power semiconductor device according to claim 1, wherein fastening the power terminal of the semiconductor device to the electrode of the terminal block presses the semiconductor device to the heat sink.

13. A method for manufacturing the power semiconductor device according to claim 1, the method comprising:

preparing the semiconductor device and the heat sink; and thermally curing the adhesive to bond the semiconductor device to the heat sink through the adhesive with the semiconductor device being fastened by a clamp fixture.

14. A method for manufacturing the power semiconductor device according to claim 1, the method comprising:

preparing the semiconductor device, the terminal block, and the heat sink;

disposing the semiconductor device on the heat sink; and fastening the power terminal to the terminal block with the semiconductor device being disposed on the heat sink and being fastened by a clamp fixture.

15. The method according to claim 14, comprising thermally curing the adhesive to bond the semiconductor device to the heat sink through the adhesive with the semiconductor device being disposed on the heat sink and being fastened by a clamp fixture identical to or different from the clamp fixture.

16. The method according to claim 14, comprising fastening the power terminal to the terminal block to press the semiconductor device to the heat sink.

17. The method according to claim 16, wherein the semiconductor device disposed on the heat sink has a clearance between a lower surface of the power terminal and the electrode of the terminal block with no external force being applied to the power terminal, before the power terminal is fastened to the terminal block.

18. A method for manufacturing the power semiconductor device according to claim 1, the method comprising:

preparing the semiconductor device, the terminal block, and the heat sink;

disposing the semiconductor device on the heat sink;

fastening the power terminal to the terminal block with the semiconductor device being disposed on the heat sink; and fastening the power terminal to the terminal block to press the semiconductor device to the heat sink.

19. The method according to claim 18, wherein the semiconductor device disposed on the heat sink has a clearance between a lower surface of the power terminal and the electrode of the terminal block with no external force being applied to the power terminal, before the power terminal is fastened to the terminal block.

* * * * *